(12) United States Patent
Smith

(10) Patent No.: US 10,062,713 B1
(45) Date of Patent: Aug. 28, 2018

(54) DEVICES AND METHODS FOR FULLY DEPLETED SILICON-ON-INSULATOR BACK BIASING

(71) Applicant: NXP USA, Inc., Austin, TX (US)

(72) Inventor: Bradley Paul Smith, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/698,679

(22) Filed: Sep. 8, 2017

(51) Int. Cl.
| *H01L 27/115* | (2017.01) |
| *H01L 27/12* | (2006.01) |
| *H01L 29/78* | (2006.01) |
| *H01L 29/66* | (2006.01) |
| *H01L 21/84* | (2006.01) |
| *H01L 21/74* | (2006.01) |
| *H01L 29/10* | (2006.01) |

(52) U.S. Cl.
CPC .......... *H01L 27/1203* (2013.01); *H01L 21/74* (2013.01); *H01L 21/84* (2013.01); *H01L 29/1083* (2013.01); *H01L 29/66537* (2013.01); *H01L 29/7838* (2013.01)

(58) Field of Classification Search
CPC .................................................. H01L 27/115
See application file for complete search history.

(56) References Cited

U.S. PATENT DOCUMENTS

| 6,780,686 B2 | 8/2004 | Wei et al. |
| 8,482,070 B1 * | 7/2013 | Flatresse ............. H01L 21/8228 257/351 |
| 2016/0268424 A1 | 9/2016 | Morgan |

OTHER PUBLICATIONS

Grenouillet et al., "UTBB FDSOI transistors with dual STI for a multi-Vt strategy at 20nm node and below," Dec. 2012 IEEE IEDM, 4 pages.

* cited by examiner

*Primary Examiner* — Peniel M Gumedzoe
*Assistant Examiner* — Christopher Johnson

(57) ABSTRACT

An integrated circuit includes a first device having a first threshold voltage (Vt) adjusting implant extension region having a first conductivity type and extending from a first implant rail region under an entirety of a first channel region. The first implant rail region and first Vt adjusting implant extension region are contiguous, and the first channel region is over an insulating layer and the insulating layer is over the first implant rail region and first Vt adjusting implant extension region. A second device has a second Vt adjusting implant extension region having the first conductivity type and extending from a second implant rail region under an entirety of a second channel region. The second implant rail region and second Vt adjusting implant extension region are contiguous, and the second channel region is over the insulating layer and the insulating layer is over the second implant rail region and second Vt adjusting implant extension region.

20 Claims, 2 Drawing Sheets

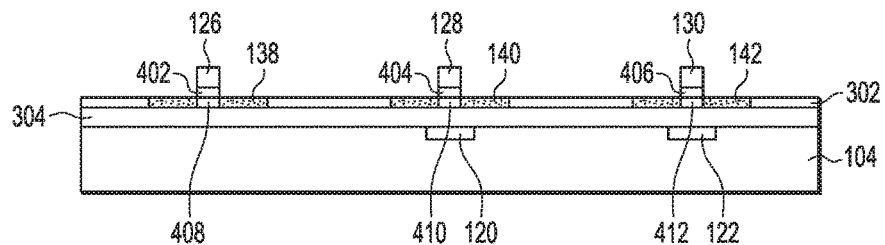
FIG. 4
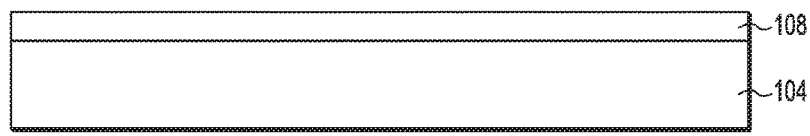
FIG. 5
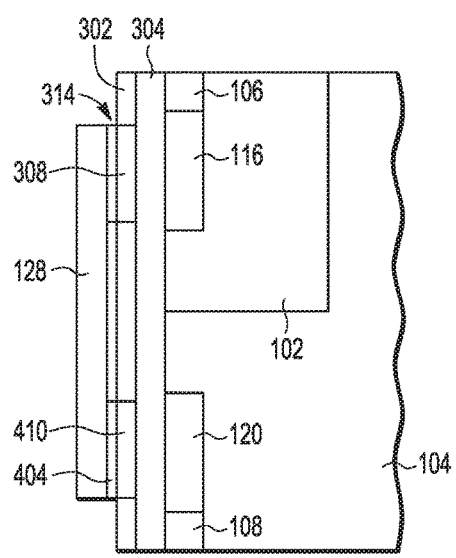 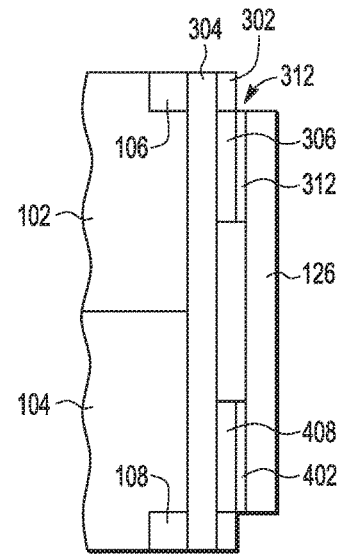
FIG. 6　　　　　　　FIG. 7

DEVICES AND METHODS FOR FULLY DEPLETED SILICON-ON-INSULATOR BACK BIASING

BACKGROUND

Field

This disclosure relates generally to back biasing semiconductor devices, and more specifically, to back biasing semiconductor devices on fully depleted silicon-on-insulator substrates.

Related Art

Fully-depleted silicon-on-insulator (FDSOI) devices use very thin bottom oxide (BOX) and doped backgates in the substrate to control threshold voltage (VT). The devices are generally drawn as "well" implants, even though they do not make physical contact with the device. Regular VT (RVT) devices have a well with N-doping (N-well) under P-type Field-Effect Transistors (PFETs) and a well with P-doping (P-well) under N-type Field-Effect Transistors (NFETs). The wells are swapped for Low VT (LVT) devices where an N-well is under NFETs and a P-well is under PFETs. These wells can be biased to modulate VT even more. Since they are relatively deep well implants, the backgates have relatively large pitches. Each well requires an electrical connection and swapping VT during logic synthesis is very difficult because similar VT cells and/or add extra well ties must be grouped. Furthermore, applying bias to P-wells requires N-well isolation rings, which consumes even more area.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 4 illustrates another horizontal side cross-sectional view of regular and low threshold voltage devices of FIG. 1.

FIG. 5 illustrates another horizontal side cross-sectional view of regular and low threshold voltage devices of FIG. 1.

FIG. 6 illustrates a vertical side cross-sectional view of regular threshold voltage devices of FIG. 1.

FIG. 7 illustrates a vertical side cross-sectional view of low threshold voltage devices of FIG. 1.

DETAILED DESCRIPTION

Devices and methods for are disclosed for back biasing semiconductor devices on fully depleted silicon-on-insulator (FDSOI) substrates in which shallow implants are used under the channel regions only, not as "well" implants that extend past the channel regions. An N-type implant is added to a P-well to make an LVT N-channel Field-Effect Transistors (NFET) and a P-type implant is added to an N-well to make an LVT P-channel Field-Effect Transistor (PFET). Using shallow implants allows smaller pitches, which enables regular threshold voltage (RVT) logic devices to connect the implants for abutting low threshold voltage (LVT) devices. Thus, logic devices with different VTs can be easily swapped during synthesis, just like non-FDSOI technologies, because they are surrounded by wells of opposite polarity. Bias domains are grouped and tied to a corresponding well tie.

Figure 1:
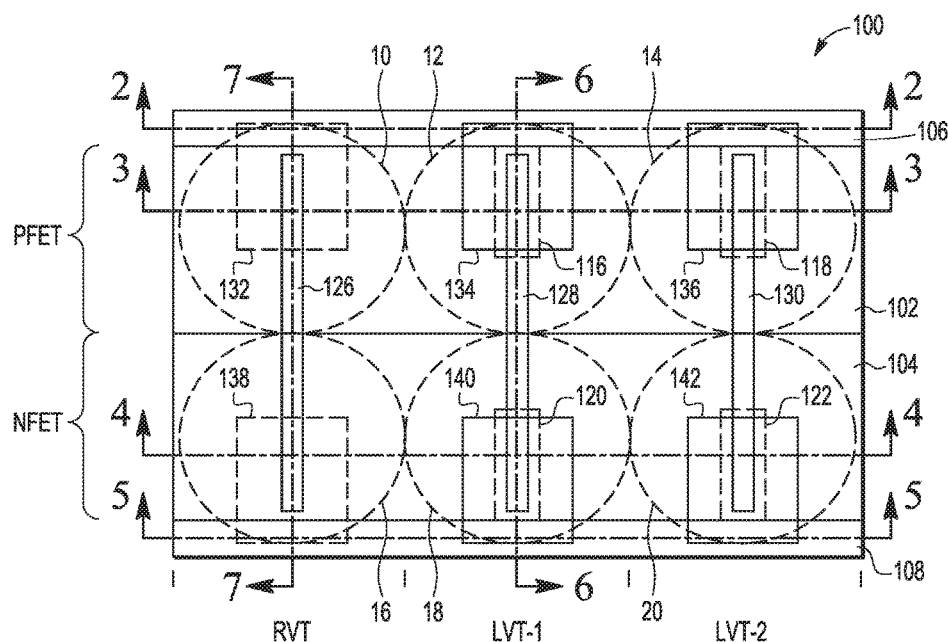
FIG. 1 illustrates a top view of an embodiment of an integrated circuit device with regular and low threshold voltage devices in accordance with selected embodiments of the invention.

FIG. 1 illustrates a top view of an embodiment of an integrated circuit device 100 with regular and low threshold voltage devices 10, 12, 14, 16, 18, 20 in accordance with selected embodiments of the invention. Device 10 is an RVT PFET, devices 12, 14 are LVT PFETs, device 16 is an RVT NFET, and devices 18, 20 are LVT NFETs. IC device 100 includes a P-type substrate 104 doped with an N-type material to form N-well 102. One edge of the perimeter of N-well 102 opposite an edge of N-well 102 that borders P-well 104 is implanted with P-type material to form P-rail 106. One edge of the perimeter of P-well 104 opposite an edge of P-well 104 that borders N-well 102 is implanted with N-type material to form N-rail 108. P-rail 106 and N-rail 108 are doped regions that extend continuously across the respective edges of N-well 102 and P-well 104 in RVT, LVT-1 and LVT-2 regions. P-rail 106 and N-rail 108 can have a rectangular shape, or other suitable shape.

RVT PFET device 10 is formed in an RVT region of N-well 102 and includes conductive gate 126 over active region 132. Gate 126 is formed over N-well 102 but is not in contact with N-rail 104 or P-rail 106.

LVT PFET device 12 is formed in an LVT-1 region of N-well 102 and includes conductive gate 128 over active region 134 and P-implant region 116 in N-well 102. Gate 128 is formed over N-well 102 and is not in contact with N-rail 104 or P-rail 106. P-implant region 116 is in electrical contact with P-rail 106.

LVT PFET device 14 is formed in an LVT-2 region of N-well 102 and includes conductive gate 130 over active region 136 and P-implant region 118 in N-well 102. Gate 130 is formed over N-well 102 and is not in contact with N-rail 104 or P-rail 106. P-implant region 118 is in electrical contact with P-rail 106.

RVT NFET device 16 is formed in an RVT region of P-well 104 and includes conductive gate 126 over active region 138. Gate 126 is formed over P-well 104 and is contiguous with gate 126 over N-well 102.

LVT NFET device 18 is formed in an LVT-1 region of P-well 104 and includes conductive gate 128 over active region 140 and P-implant region 120 in P-well 104. Gate 128 is formed over P-well 104 and is contiguous with gate 128 over N-well 102. P-implant region 120 is in electrical contact with P-rail 106.

LVT NFET device 20 is formed in an LVT-2 region of P-well 104 and includes conductive gate 130 over active region 142 and P-implant region 122 in P-well 104. Gate 130 is formed over P-well 104 and is contiguous with gate 130 over N-well 102. P-implant region 122 is in electrical contact with P-rail 106.

Note that P-implant regions 116, 118, 120, 122 can also be referred to herein as threshold voltage (Vt) adjusting implant extension regions.

P-well 104 can be formed by implanting or doping a P-type material such as boron, boron difluoride ($BF_2$) or other suitable P-type material in a suitable combination of implant energy and dose in a substrate. The substrate can be of semiconductor material or combinations of materials, such as gallium arsenide, silicon germanium, silicon-oninsulator (SOI), silicon, monocrystalline silicon, the like, and combinations of the above. N-well 102 can be formed by masking a region of P-well 104 and implanting or doping with an N-type material such as arsenic, phosphorous or other suitable N-type material in a suitable combination of implant energy and dose in the P-well. In some implementations, N-well 102 is formed in P-well 104 with no isolation between N-well 102 and P-well 104. Although one N-well 102 and one P-well 104 are shown in FIG. 1, additional N-wells and P-wells can be included in IC device 100, with N-rail 106 between adjacent P-wells and P-rail 108 between adjacent N-wells 102. In selected embodiments, depth or thickness of N-well 102 and P-well 104 is between 1 and 3 micrometers. Other suitable thicknesses or depths can be used, however.

Gates 126, 128, 130 can be part of a gate structure that is formed by depositing or thermally growing one or more layers of dielectric material on N-well 102 and P-well 104, depositing conductive material over the dielectric material, and patterning the dielectric and conductive materials to form continuous strips of gate structures that are separated a specified distance from one another by etching the unmasked material. The conductive material can be metal, polysilicon, or other suitable electrically conductive material.

Active regions 132-136 in N-well 102 can be formed by masking gates 126, 128, 130, P-well 104, and inactive regions of N-well 102 with photoresist material, and implanting or doping a P-type material such as boron, boron difluoride ($BF_2$) or other suitable P-type material in a suitable combination of implant energy and dosage in N-well 102. The photoresist material is then removed and further manufacturing processes performed.

Active regions 138-142 in P-well 104 can be formed by masking gates 126, 128, 130, N-well 102, and inactive regions of P-well 104 with photoresist material, and implanting or doping an N-type material such as phosphorous or other suitable N-type material in a suitable combination of implant energy and dosage in P-well 104. The photoresist material is then removed and further manufacturing processes performed.

Active regions 132-142 can be configured as source/drain electrodes for devices 10-20 with one or more regions of doping levels, angles, extensions, and depths. A channel (not shown) of doped material having opposite polarity than active regions 132-142 under gates 126-130 allows current to flow between source and drain regions when devices 10-20 are in conductive mode.

Figure 2:
FIG. 2 illustrates a horizontal side cross-sectional view of regular and low threshold voltage devices of FIG. 1.

FIG. 2 illustrates a horizontal side cross-sectional view at line 2-2 of the IC device 100 of FIG. 1 through P-rail 106 and underlying N-well 102. After N-well 102 is formed, P-rail 106 can be formed by masking gates 126, 128, 130 and active and inactive regions of P-well 104 and N-well 102, and implanting or doping an P-type material such as boron, boron difluoride ($BF_2$) or other suitable P-type material in a suitable combination of implant energy and dosage in N-well 102. Note that P-well 104 may be present beneath N-well 102, although P-well 104 is not shown in FIG. 2. In selected embodiments, depth or thickness of P-rail 106 is between 0.1 and 1 micrometers. Other suitable thicknesses or depths can be used, however.

Figure 3:
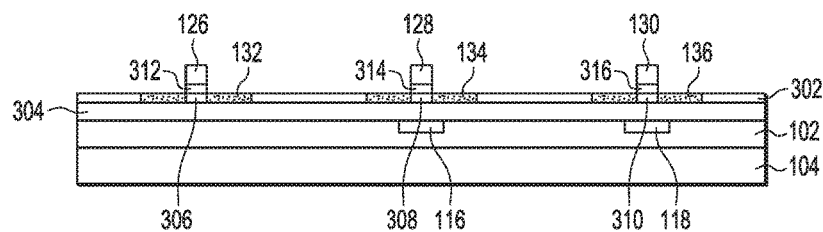
FIG. 3 illustrates a horizontal side cross-sectional view of regular and low threshold voltage devices of FIG. 1.

FIG. 3 illustrates a horizontal side cross-sectional view at line 3-3 of IC device 100 including the regular and low threshold voltage PFET devices 10, 12, 14 in N-well 102 of FIG. 1. Implant regions 116, 118 are shown embedded in N-well 102. A layer of P-well 104 is below N-well 102. Buried oxide (BOX) layer 304 is formed on the upper surface of N-well 102. N-type semiconductor layer 302 is formed on BOX layer 304, and active regions 132, 134, 136 are formed using a patterned implant of P-type material. Channel regions 306, 308, 310 under gates 126, 128, 130 are not implanted with the P-type material. One or more layers of gate dielectric material is formed over semiconductor layer 302 and covered with one or more layers of gate material. The gate dielectric and gate materials are patterned and etched to form gate dielectric layers 312, 314, 316, and gates 126, 128, 130. RVT PFET device 10 thus includes gate 126, gate dielectric 312, gate channel 306, and source/drain electrodes in active region 132. LVT PFET device 12 thus includes gate 128, gate dielectric 314, gate channel 308, source/drain electrodes in active region 134, and implant region 116 coupled to P-rail 106. LVT PFET device 14 thus includes gate 130, gate dielectric 316, gate channel 310, source/drain electrodes in active region 136, and implant region 118 coupled to P-rail 106.

FIG. 4 illustrates a horizontal side cross-sectional view at line 4-4 of IC device 100 including the regular and low threshold voltage NFET devices 16, 18, 20 in N-well 102 of FIG. 1. Implant regions 120, 122 are shown embedded in P-well 104. Buried oxide (BOX) layer 304 is formed on the upper surface of P-well 104. P-type semiconductor layer 302 is formed on BOX layer 304, and active regions 138, 140, 142 are formed using a patterned implant of N-type material. Channel regions 408, 410, 412 under gates 126, 128, 130 are not implanted with the N-type material. One or more layers of gate dielectric material is formed over semiconductor layer 302 and covered with one or more layers of gate material. The gate dielectric and gate materials are patterned and etched to form gate dielectric layers 402, 404, 406, and gates 126, 128, 130. RVT NFET device 16 thus includes gate 126, gate dielectric 402, gate channel 408, and source/drain electrodes in active region 138. LVT NFET device 18 thus includes gate 128, gate dielectric 404, gate channel 410, source/drain electrodes in active region 140, and implant region 120 coupled to N-rail 108. LVT NFET device 20 thus includes gate 130, gate dielectric 406, gate channel 412, source/drain electrodes in active region 142, and implant region 122 coupled to N-rail 108.

FIG. 5 illustrates a horizontal side cross-sectional view at line 5-5 of the IC device 100 of FIG. 1 through N-rail 108 and underlying P-well 104. N-rail 108 can be formed by masking gates 126, 128, 130 and active and inactive regions of P-well 104 and N-well 102, and implanting or doping an N-type material such as phosphorous or other suitable N-type material in a suitable combination of implant energy and dosage in P-well 104. Note that although not shown in FIG. 5, another layer of semiconductor substrate material can be under P-well 104. In selected embodiments, depth or thickness of N-rail 108 is between 0.1 and 1 micrometers. Other suitable thicknesses or depths can be used, however.

FIG. 6 illustrates a vertical side cross-sectional view at line 6-6 of the LVT PFET device 12 in N-well 102 and LVT NFET device 18 in P-well 104 of FIG. 1. N-well 102 is implanted in P-well 104. P-type implant region 116 is shown embedded in N-well 102 and N-type implant region 120 is shown embedded in P-well 104. Buried oxide (BOX) layer 304 is formed on the upper surface of N-well 102 and P-well 104. P-type semiconductor layer 302 is formed on BOX layer 304, and active regions 134, 140 are formed using a patterned implant of N-type material. One or more layers of gate dielectric material is formed over semiconductor layer 302 and covered with one or more layers of gate material. The gate dielectric and gate materials are patterned and etched to form gate dielectric layers 314, 404, and gate 128.

LVT PFET device 12 thus includes gate 128, gate dielectric 314, source/drain electrodes in active region 134, and implant region 116 coupled to P-rail 106. LVT NFET device 18 thus includes gate 128, gate dielectric 404, source/drain electrodes in active region 140, and implant region 120 coupled to N-rail 108.

FIG. 7 illustrates a vertical side cross-sectional view at line 7-7 of the RVT PFET device 10 in N-well 102 and RVT NFET device 16 in P-well 104 of FIG. 1. N-well 102 is implanted in P-well 104. Buried oxide (BOX) layer 304 is formed on the upper surface of N-well 102 and P-well 104. P-type semiconductor layer 302 is formed on BOX layer 304, and active regions 132, 138 are formed using a patterned implant of N-type material. One or more layers of gate dielectric material is formed over semiconductor layer 302 and covered with one or more layers of gate material. The gate dielectric and gate materials are patterned and etched to form gate dielectric layers 314, 404, and gate 126. RVT PFET device 10 thus includes gate 126, gate dielectric 314, and source/drain electrodes in active region 132. RVT NFET device 16 thus includes gate 126, gate dielectric 404, and source/drain electrodes in active region 138.

By now it should be appreciated that there has been provided devices and methods for back biasing gates 128, 130 in fully-depleted silicon-on-insulator (FDSOI) IC device 100 such that changing threshold voltage during logic synthesis can be achieved by swapping between regular threshold voltage devices 10, 16 and low threshold voltage devices 12, 14, 18, 20. N-wells 102 and P-wells 104 are surrounded by well and rails 106, 108 of opposite polarity, thus providing isolation and enabling gates 128, 130 of devices 12, 14, 18, 20 to be biased during operation using shallow implants 116, 122 in channel regions 306, 308, 310, 408, 410, 412 instead of deep wells that have relatively large pitches and require their own isolation rings, which consume even more area. In addition, swapping threshold voltage polarity between adjacent devices during the design stage is simplified because cells having the same threshold voltage and/or extra well ties do not need to be grouped.

In some embodiments, an integrated circuit can comprise a first well (104) of a first conductivity type (P) formed in a substrate; a second well (102) of a second conductivity type (N), opposite the first conductivity type, formed in the substrate, immediately adjacent the first well, and an insulating layer (304) over the first well and the second well; a first device (12) having: a first gate (128) over a first channel region (part of 134) having the first conductivity type (P) and formed over the second well (102), a first implant rail region formed in the second well (102) extending across the first device and having the first conductivity type, and a first threshold voltage (Vt) adjusting implant extension region having the first conductivity type and extending from the first implant rail region under an entirety of the first channel region. The first implant rail region and first VT adjusting implant extension region are contiguous, and the first channel region is over the insulating layer and the insulating layer is over the first implant rail region and first Vt adjusting implant extension region. A second device (14) can have a second gate (130) over a second channel region (part of 136) having the first conductivity type (P) and formed over the second well (102), a second implant rail region formed in the second well extending across the second device and having the first conductivity type, and a second threshold voltage (Vt) adjusting implant extension region having the first conductivity type and extending from the second implant rail region under an entirety of the second channel region. The second implant rail region and second Vt adjusting implant extension region are contiguous, and the second channel region is over the insulating layer and the insulating layer is over the second implant rail region and second Vt adjusting implant extension region. The first and second implant rail regions can be contiguous and correspond to portions of a same implant rail of the integrated circuit.

In another aspect, the first and second Vt adjusting implant extension regions can be configured to receive a same potential as the same implant rail.

In another aspect, the first and second implant regions and first and second Vt adjusting implant regions can extend a distance in a range of 0.1 um to 1 um from the insulating layer into the second well.

In another aspect, the first implant rail region can be located along a border of the first device and the second implant region can be located along a border of the second device.

In another aspect, the integrated circuit can further comprise a third device (10) having: a third gate (126) over a third channel region (part of 132) having the first conductivity type (P) and formed over the second well (102), a third implant rail region formed in the second well (102) extending across a border of the third device, contiguous to the first implant region, and having the first conductivity type. The second well can be directly under a portion of the insulating layer that is directly under an entirety of the third channel region.

In another aspect, a region of the second well that is directly under the entirety of the third channel region can be devoid of implant regions having the first conductivity type.

In another aspect, the first device and the third device can be immediately adjacent devices.

In another aspect, the first device can be characterized as a low threshold voltage device due to the first adjusting implant extension region and the third device can be characterized as a regular threshold voltage device which has a higher threshold voltage than the first device.

In another aspect, the integrated circuit can further comprise a third device (18) having: a third gate (128) over a third channel region (part of 140) having the second conductivity type (N) and formed over the first well (104 P), a third implant rail region formed in the first well (104) extending across the third device and having the second conductivity type (N), and a third threshold voltage (Vt) adjusting implant extension region having the second conductivity type and extending from the third implant rail region under an entirety of the third channel region. The third implant rail region and third VT adjusting implant extension region are contiguous, and the third channel region is over the insulating layer and the insulating layer is over the third implant rail region and third Vt adjusting implant extension region.

In another aspect, third implant rail region can be isolated from the first and second implant rail regions and correspond to a portion of a second implant rail of the integrated circuit.

In another aspect, the first and third devices can be immediately adjacent devices and the first well and second well between the first and third devices are immediately adjacent.

In another aspect, the first implant rail can be located along a first border of the first device and the third implant rail can be located along a first border of the third device. The first gate and the third gate can be between the first borders of the first and third device.

In another aspect, the first gate and the third gate can be portions of a continuous conductive gate structure.

In other selected embodiments, an integrated circuit can comprise a first well (104) of a first conductivity type (P) formed in a substrate; a second well (102) of a second conductivity type (N), opposite the first conductivity type, formed in the substrate, immediately adjacent the first well; an insulating layer (304) over the first well and the second well; a first device (12) having: a first gate (128) over a first channel region (part of 134) having the first conductivity type (P) and formed over the second well (102), a first implant rail region formed in the second well (102) extending across the first device and having the first conductivity type, and a first threshold voltage (Vt) adjusting implant extension region having the first conductivity type and extending from the first implant rail region under an entirety of the first channel region. The first implant rail region and first VT adjusting implant extension region can be contiguous, and the first channel region can be over the insulating layer and the insulating layer can be over the first implant rail region and first Vt adjusting implant extension region. A second device (18) can have a second gate (128) over a second channel region (part of 140) having the second conductivity type (N) and formed over the first well (104 P), a second implant rail region formed in the first well (104) extending across the second device and having the second conductivity type (N), and a second threshold voltage (Vt) adjusting implant extension region having the second conductivity type and extending from the second implant rail region under an entirety of the second channel region. The second implant rail region and second VT adjusting implant extension region can be contiguous, and the second channel region can be over the insulating layer and the insulating layer can be over the second implant rail region and second Vt adjusting implant extension region. The first and second devices can be immediately adjacent devices and the first well and the second well between the first and second devices can be immediately adjacent.

In another aspect, the first implant rail region can be isolated from the second implant rail regions, and the first implant rail region can correspond to a portion of a first implant rail of the integrated circuit and the second implant rail region can correspond to a portion of a second implant rail of the integrated circuit.

In another aspect, the integrated circuit of claim 15 can further comprise a first set of immediately adjacent devices each having a threshold voltage adjusting implant region extending under an entirety of a corresponding channel region contiguous with the first rail; and a second set of immediately adjacent devices each having a threshold voltage adjusting implant region extending under an entirety of a corresponding channel region contiguous with the second rail.

In another aspect, the first implant rail region can be located along a first border of the first device and the second implant rail region can be located along a second border of the second device. The first gate and the second gate can be between the first borders of the first and second device.

In still further selected embodiments, an integrated circuit can comprise a first well (104) of a first conductivity type (P) formed in a substrate; a second well (102) of a second conductivity type (N), opposite the first conductivity type, formed in the substrate, immediately adjacent the first well; an insulating layer (304) over the first well and the second well; and a first device (12) characterized as a low threshold voltage device. The first device can include: a first gate (128) over a first channel region (part of 134) having the first conductivity type (P) and formed over the second well (102), a first implant rail region formed in the second well (102) extending across a first border of the first device and having the first conductivity type, and a first threshold voltage (Vt) adjusting implant extension region having the first conductivity type and extending from the first implant rail region under an entirety of the first channel region. The first implant rail region and first VT adjusting implant extension region can be contiguous, and the first channel region can be over the insulating layer and the insulating layer can be over the first implant rail region and first Vt adjusting implant extension region. A second device (10) can be immediately adjacent a first side of the first device. The second device can be characterized as a regular threshold voltage device. The first device can have a lower threshold voltage than the second device, and the second device can comprise a second gate (126) over a second channel region (part of 132) having the first conductivity type (P) and formed over the second well (102), and a second implant rail region formed in the second well extending across a first border of the second device and having the first conductivity type. A region of the second well that is directly under the entirety of the second channel region can be devoid of implant regions having the first conductivity type, and the second implant rail region can be electrically isolated from the second gate and the second channel region. The first and second implant rail regions can be contiguous and correspond to portions of a first implant rail (106) of the integrated circuit.

In another aspect, the method can further comprise forming a first set of devices (14, etc.) immediately adjacent a second side of the first device, opposite the first side. Each device of the first set of devices can have a corresponding implant rail region (118, etc.) of the first implant rail of the integrated circuit, and a corresponding threshold voltage adjusting implant region extending under an entirety of a corresponding channel region and contiguous with the first implant rail (106) of the integrated circuit.

In another aspect, the method can further comprise forming a third device (18) immediately adjacent a third side of the first device, between the first and second sides, and having: a third gate (128) over a third channel region (part of 140) having the second conductivity type (N) and formed over the first well (104 P), a third implant rail region formed in the first well (104) extending across the third device and having the second conductivity type (N), and a third threshold voltage (Vt) adjusting implant extension region having the second conductivity type and extending from the third implant rail region under an entirety of the third channel region. The third implant rail region and third VT adjusting implant extension region can be contiguous, and the third channel region can be over the insulating layer and the insulating layer is over the third implant rail region and third Vt adjusting implant extension region. The first well and second well can be between the first and third devices are immediately adjacent, and the third implant rail region can be isolated from the first and second implant rail regions and can correspond to a portion of a second implant rail (108) of the integrated circuit.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a first well of a first conductivity type formed in a substrate;
   a second well of a second conductivity type, opposite the first conductivity type, formed in the substrate, immediately adjacent the first well;
   an insulating layer over the first well and the second well;
   a first device having:
      a first gate over a first channel region having the first conductivity type and formed over the second well,
      a first implant rail region formed in the second well extending across the first device and having the first conductivity type, and
      a first threshold voltage (Vt) adjusting implant extension region having the first conductivity type and extending from the first implant rail region under an entirety of the first channel region, wherein the first implant rail region and first Vt adjusting implant extension region are contiguous, and the first channel region is over the insulating layer and the insulating layer is over the first implant rail region and first Vt adjusting implant extension region;
   a second device having:
      a second gate over a second channel region having the first conductivity type and formed over the second well,
      a second implant rail region formed in the second well extending across the second device and having the first conductivity type, and
      a second threshold voltage (Vt) adjusting implant extension region having the first conductivity type and extending from the second implant rail region under an entirety of the second channel region, wherein the second implant rail region and second Vt adjusting implant extension region are contiguous, and the second channel region is over the insulating layer and the insulating layer is over the second implant rail region and second Vt adjusting implant extension region;
   wherein the first and second implant rail regions are contiguous and correspond to portions of a same implant rail of the integrated circuit.

2. The integrated circuit of claim 1, wherein the first and second Vt adjusting implant extension regions are configured to receive a same potential as the same implant rail.

3. The integrated circuit of claim 1, wherein the first and second implant regions and first and second Vt adjusting implant regions extend a distance in a range of 0.1 um to 1 um from the insulating layer into the second well.

4. The integrated circuit of claim 1, wherein the first implant rail region is located along a border of the first device and the second implant region is located along a border of the second device.

5. The integrated circuit of claim 4, further comprising:
   a third device having:
      a third gate over a third channel region having the first conductivity type and formed over the second well,
      a third implant rail region formed in the second well extending across a border of the third device, contiguous to the first implant region, and having the first conductivity type, and
      wherein the second well is directly under a portion of the insulating layer that is directly under an entirety of the third channel region.

6. The integrated circuit of claim 5, wherein a region of the second well that is directly under the entirety of the third channel region is devoid of implant regions having the first conductivity type.

7. The integrated circuit of claim 5, wherein the first device and the third device are immediately adjacent devices.

8. The integrated circuit of claim 7, wherein the first device is characterized as a low threshold voltage device due to the first adjusting implant extension region and the third device is characterized as a regular threshold voltage device which has a higher threshold voltage than the first device.

9. The integrated circuit of claim 4, further comprising:
   a third device having:
      a third gate over a third channel region having the second conductivity type and formed over the first well,
      a third implant rail region formed in the first well extending across the third device and having the second conductivity type, and
      a third threshold voltage (Vt) adjusting implant extension region having the second conductivity type and extending from the third implant rail region under an entirety of the third channel region, wherein the third implant rail region and third Vt adjusting implant extension region are contiguous, and the third channel region is over the insulating layer and the insulating layer is over the third implant rail region and third Vt adjusting implant extension region.

10. The integrated circuit of claim 9, wherein third implant rail region is isolated from the first and second implant rail regions and correspond to a portion of a second implant rail of the integrated circuit.

11. The integrated circuit of claim 9, wherein the first and third devices are immediately adjacent devices and the first well and second well between the first and third devices are immediately adjacent.

12. The integrated circuit of claim 9, wherein the first implant rail is located along a first border of the first device and the third implant rail is located along a first border of the third device, wherein the first gate and the third gate are between the first borders of the first and third device.

13. The integrated circuit of claim 9, wherein the first gate and the third gate are portions of a continuous conductive gate structure.

14. An integrated circuit, comprising:
a first well of a first conductivity type formed in a substrate;
a second well of a second conductivity type, opposite the first conductivity type, formed in the substrate, immediately adjacent the first well;
an insulating layer over the first well and the second well;
a first device having:
a first gate over a first channel region having the first conductivity type and formed over the second well,
a first implant rail region formed in the second well extending across the first device and having the first conductivity type, and
a first threshold voltage (Vt) adjusting implant extension region having the first conductivity type and extending from the first implant rail region under an entirety of the first channel region, wherein the first implant rail region and first Vt adjusting implant extension region are contiguous, and the first channel region is over the insulating layer and the insulating layer is over the first implant rail region and first Vt adjusting implant extension region;
a second device having:
a second gate over a second channel region having the second conductivity type and formed over the first well,
a second implant rail region formed in the first well extending across the second device and having the second conductivity type, and
a second threshold voltage (Vt) adjusting implant extension region having the second conductivity type and extending from the second implant rail region under an entirety of the second channel region, wherein the second implant rail region and second Vt adjusting implant extension region are contiguous, and the second channel region is over the insulating layer and the insulating layer is over the second implant rail region and second Vt adjusting implant extension region;
wherein the first and second devices are immediately adjacent devices and the first well and the second well between the first and second devices are immediately adjacent.

15. The integrated circuit of claim 14, wherein first implant rail region is isolated from the second implant rail regions, and the first implant rail region corresponds to a portion of a first implant rail of the integrated circuit and the second implant rail region corresponds to a portion of a second implant rail of the integrated circuit.

16. The integrated circuit of claim 15, further comprising:
a first set of immediately adjacent devices each having a threshold voltage adjusting implant region extending under an entirety of a corresponding channel region contiguous with the first rail; and
a second set of immediately adjacent devices each having a threshold voltage adjusting implant region extending under an entirety of a corresponding channel region contiguous with the second rail.

17. The integrated circuit of claim 14, wherein the first implant rail region is located along a first border of the first device and the second implant rail region is located along a second border of the second device, wherein the first gate and the second gate are between the first borders of the first and second device.

18. An integrated circuit, comprising:
a first well of a first conductivity type formed in a substrate;
a second well of a second conductivity type, opposite the first conductivity type, formed in the substrate, immediately adjacent the first well;
an insulating layer over the first well and the second well;
a first device characterized as a low threshold voltage device, wherein the first device includes:
a first gate over a first channel region having the first conductivity type and formed over the second well,
a first implant rail region formed in the second well extending across a first border of the first device and having the first conductivity type, and
a first threshold voltage (Vt) adjusting implant extension region having the first conductivity type and extending from the first implant rail region under an entirety of the first channel region, wherein the first implant rail region and first Vt adjusting implant extension region are contiguous, and the first channel region is over the insulating layer and the insulating layer is over the first implant rail region and first Vt adjusting implant extension region;
a second device immediately adjacent a first side of the first device, wherein the second device is characterized as a regular threshold voltage device, wherein the first device has a lower threshold voltage than the second device, and the second device comprises:
a second gate over a second channel region having the first conductivity type and formed over the second well,
a second implant rail region formed in the second well extending across a first border of the second device and having the first conductivity type, wherein a region of the second well that is directly under the entirety of the second channel region is devoid of implant regions having the first conductivity type, and the second implant rail region is electrically isolated from the second gate and the second channel region,
wherein the first and second implant rail regions are contiguous and correspond to portions of a first implant rail of the integrated circuit.

19. The device of claim 18, further comprising:
a first set of devices immediately adjacent to a second side of the first device, opposite the first side, wherein each device of the first set of devices has:
a corresponding implant rail region of the first implant rail of the integrated circuit, and a corresponding threshold voltage adjusting implant region extending under an entirety of a corresponding channel region and contiguous with the first implant rail of the integrated circuit.

20. The device of claim 19, further comprising:
a third device immediately adjacent to a third side of the first device, between the first and second sides, and having:
a third gate over a third channel region having the second conductivity type and formed over the first well,
a third implant rail region formed in the first well extending across the third device and having the second conductivity type, and
a third threshold voltage (Vt) adjusting implant extension region having the second conductivity type and extending from the third implant rail region under an entirety of the third channel region, wherein the third implant rail region and third Vt adjusting implant extension region are contiguous, and the third channel region is over the insulating layer and the insulating layer is over the third implant rail region and third Vt adjusting implant extension region,
wherein the first well and second well between the first and third devices are immediately adjacent, and
wherein the third implant rail region is isolated from the first and second implant rail regions and corresponds to a portion of a second implant rail of the integrated circuit.

\* \* \* \* \*